(12) United States Patent
Miyasaka et al.

(10) Patent No.: US 12,014,016 B2
(45) Date of Patent: Jun. 18, 2024

(54) DETECTION DEVICE AND DISPLAY DEVICE

(71) Applicant: Japan Display Inc., Tokyo (JP)

(72) Inventors: Koichi Miyasaka, Tokyo (JP);
Yoshikatsu Imazeki, Tokyo (JP);
Yoichi Kamijo, Tokyo (JP); Shuichi Osawa, Tokyo (JP); Yoshifumi Kamei, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/950,232

(22) Filed: Sep. 22, 2022

(65) Prior Publication Data

US 2023/0019991 A1      Jan. 19, 2023

Related U.S. Application Data

(63) Continuation of application No. PCT/JP2021/010190, filed on Mar. 12, 2021.

(30) Foreign Application Priority Data

Mar. 26, 2020   (JP) ................. 2020-056413

(51) Int. Cl.
*G06F 3/044* (2006.01)
*G01R 27/26* (2006.01)

(52) U.S. Cl.
CPC ....... *G06F 3/0447* (2019.05); *G01R 27/2605* (2013.01)

(58) Field of Classification Search
CPC .... G06F 3/0447; G06F 3/0446; G06F 3/0445; G06F 2203/04103; G01R 27/2605
See application file for complete search history.

(56) References Cited

U.S. PATENT DOCUMENTS

2018/0035541 A1\*   2/2018   Kamijo ............ G02F 1/134309
2020/0226347 A1    7/2020   Kurasawa et al.

FOREIGN PATENT DOCUMENTS

| JP | 2016-150578 A | 8/2016 |
|----|---------------|--------|
| JP | 2018-081485 A | 5/2018 |
| WO | WO2019/009315 A1 | 1/2019 |
| WO | WO2019/065937 A1 | 4/2019 |

OTHER PUBLICATIONS

International Search Report issued in International Patent Application No. PCT/JP2020/010190 on Apr. 13, 2021 and English translation of same. 5 pages.
Written Opinion issued in International Patent Application No. PCT/JP2021/010190 on Apr. 13, 2021. 4 pages.

\* cited by examiner

*Primary Examiner* — Patrick N Edouard
*Assistant Examiner* — Joseph P Fox
(74) *Attorney, Agent, or Firm* — K&L Gates LLP

(57) ABSTRACT

According to one embodiment, a detection device includes a base, a sensor electrode provided on the base, the sensor electrode bending in a planar view, an insulating layer on the sensor electrode, and a projection provided on the insulating layer, wherein the sensor electrode is apart from the projection in a planar view.

10 Claims, 12 Drawing Sheets

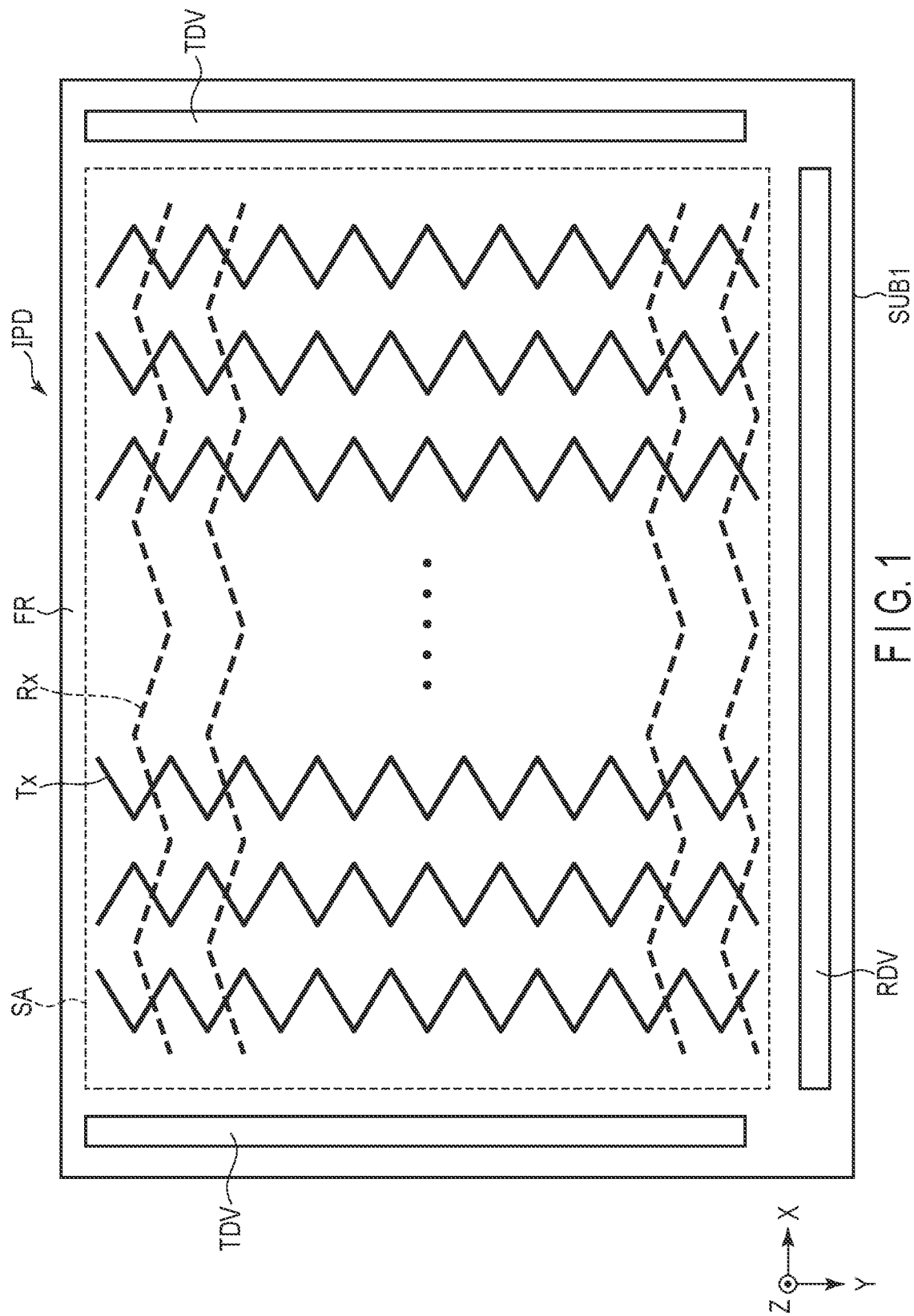
F I G. 1

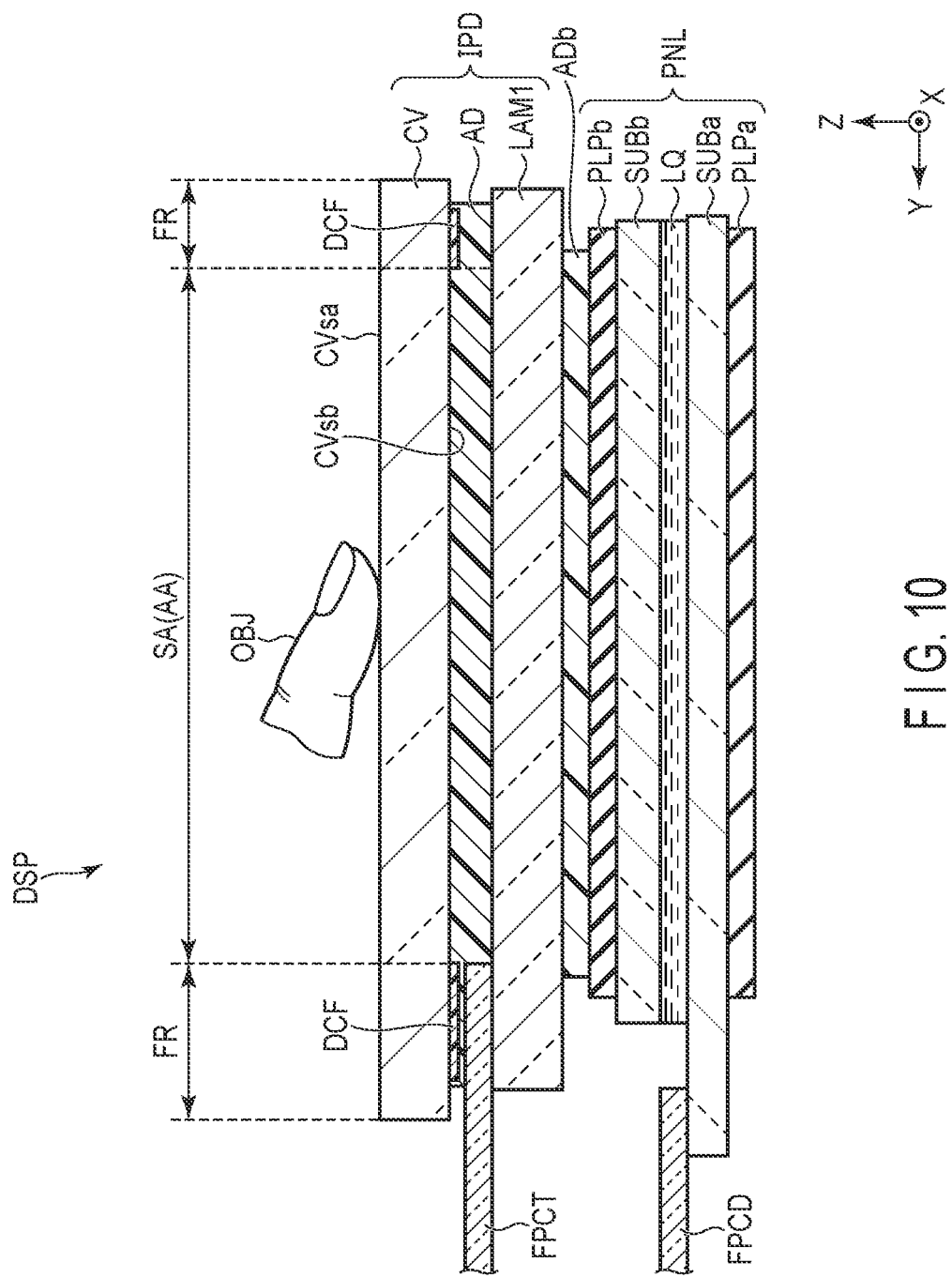
F I G. 10

DETECTION DEVICE AND DISPLAY DEVICE

CROSS-REFERENCE TO RELATED APPLICATIONS

This application is a Continuation Application of PCT Application No. PCT/JP2021/010190, filed Mar. 12, 2021 and based upon and claiming the benefit of priority from Japanese Patent Application No. 2020-056413, filed Mar. 26, 2020, the entire contents of all of which are incorporated herein by reference.

FIELD

Embodiments described herein relate generally to a detection device and a display device.

BACKGROUND

There are known a detection device that detects fingerprints based on a change in electrostatic capacitance across a drive electrode and a detection electrode, and a display device including the detection device.

BRIEF DESCRIPTION OF THE DRAWINGS

FIG. 1 is a plan view showing a detection device according to an embodiment.

FIG. 10 is a cross-sectional view showing a display device having a detection function according to the embodiment.

DETAILED DESCRIPTION

Figure 2:
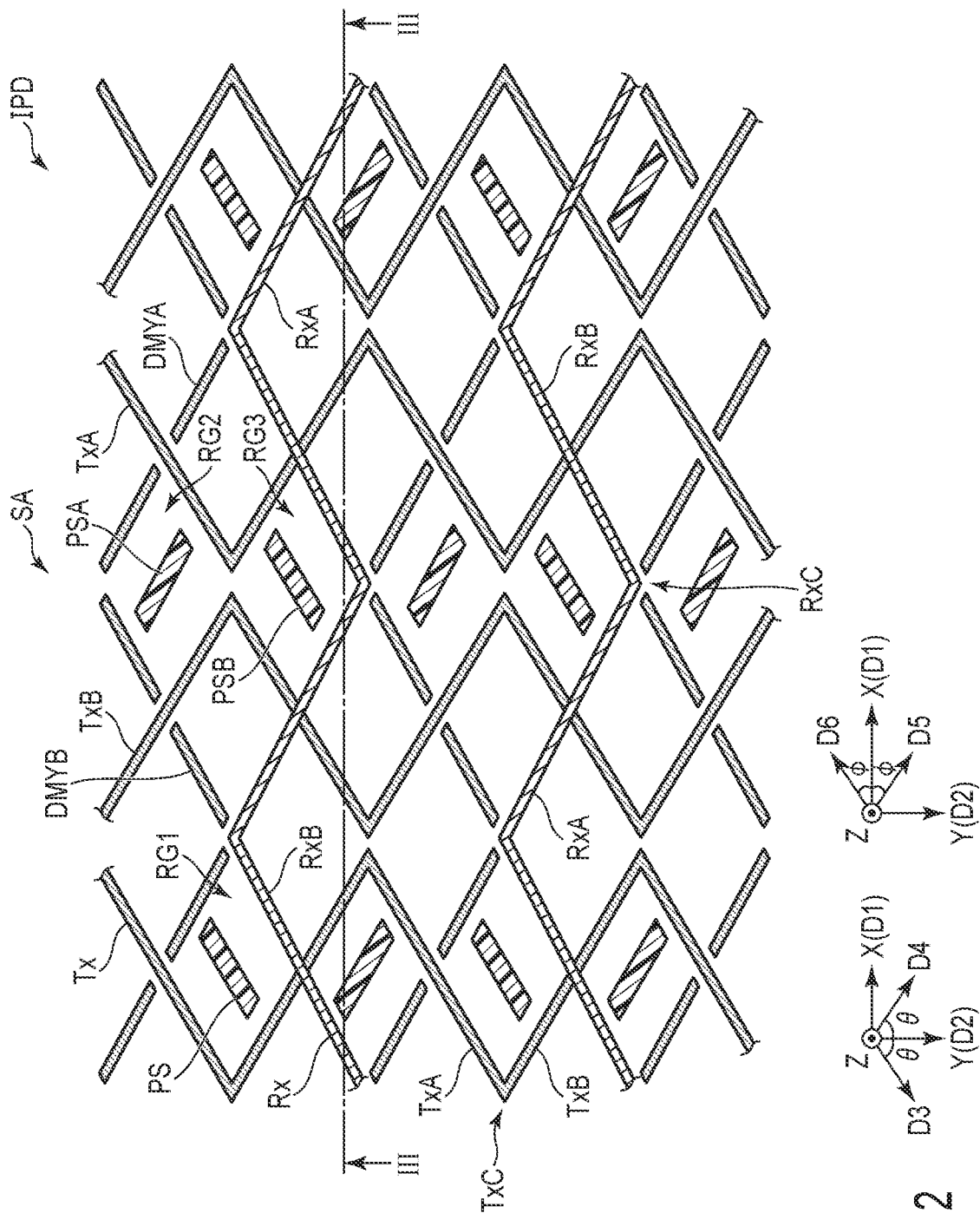
FIG. 2 is a partially enlarged view of a sensor region SA of a detection device IPD of FIG. 1.

In general, according to one embodiment, a detection device comprises a base;
a sensor electrode provided on the base, the sensor electrode bending in a planar view;
an insulating layer on the sensor electrode; and
a projection provided on the insulating layer, wherein
the sensor electrode is apart from the projection in a planar view.

According to another embodiment, a detection device comprises
a base;
a sensor electrode provided on the base, the sensor electrode bending from one to another of two directions intersecting with each other;
an insulating layer on the sensor electrode; and
a projection provided on the insulating layer, wherein
the projection comprises a long side and a short side in a planar view, and
an extending direction of the long side of the projection matches one of the two directions.

According to still another embodiment, a display device comprises a display panel, a detection device, and an adhesive that bonds the display panel to the detection device,
the detection device including:
a base,
a sensor electrode provided on the base, the sensor electrode bending from one to another of two directions intersecting with each other,
an insulating layer on the sensor electrode, and
a projection provided on the insulating layer, wherein
the sensor electrode is apart from the projection in a planar view, and
the adhesive has translucency.

According to another embodiment, a display device comprises a display panel, a detection device, and an adhesive for bonding the display panel and the detection device,
the detection device including:
a base,
a sensor electrode provided on the base, the sensor electrode bending from one to another of two directions intersecting with each other,
an insulating layer on the sensor electrode, and
a projection provided on the insulating layer, wherein
the projection has a long side and a short side in a planar view,
an extending direction of the long side of the projection matches one of the two directions, and
the adhesive has translucency.

The present embodiment provides a detection device and a display device in which reflection stripes are reduced and visibility is improved. Alternatively, the present embodiment provides a detection device and a display device with improved reliability in which electrodes and wiring lines are not broken.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

Detection devices of embodiments will be described in detail with reference to the accompanying drawings.

In the embodiments, a first direction X, a second direction Y and a third direction Z are orthogonal to each other, but they may intersect at an angle other than 90 degrees. In the following descriptions, a direction forwarding a tip of an arrow indicating the third direction Z is referred to as "upward" or "above" and a direction forwarding oppositely from the tip of the arrow is referred to as "downward" or "below". The first direction X, the second direction Y and third direction Z may as well be referred to as an X direction, a Y direction and a Z direction, respectively.

With such expressions "a second member above a first member" and "a second member below a first member", the second member may be in contact with the first member or may be remote from the first member. In the latter case, a third member may be interposed between the first member and the second member. On the other hand, with such expressions "a second member on a first member" and "a second member on a first member", the second member is meant to be in contact with the first member.

In addition, it is assumed that there is an observation position to observe the semiconductor substrate on a tip side of an arrow in the third direction Z, and viewing from this observation position toward the X-Y plane defined by the first direction X and the second direction Y is referred to as a planar view. Viewing a cross section of the transistor in an X-Z plane defined by the first direction X and the third direction Z or a Y-Z plane defined by the second direction Y and the third direction Z is referred to as a cross-sectional view.

Embodiment

FIG. 1 is a plan view showing a detection device according to an embodiment. A detection device IPD shown in FIG. 1 includes a substrate SUB1, a sensor region SA provided on the substrate SUB1, and a frame area FR provided outside the sensor region SA. The sensor region SA is provided with a drive electrode Tx and a detection electrode Rx. Note that the drive electrode Tx and the detection electrode Rx may be collectively referred to as a sensor electrode.

In the frame area FR, a drive electrode driver TDV that drives the drive electrode Tx and a detection electrode driver RDV that drives the detection electrode Rx are provided. The drive electrode driver TDV and the detection electrode driver RDV may be controlled by a control unit, not shown. Alternatively, a part of the drive electrode driver TDV and the detection electrode driver RDV may not be provided on the substrate SUB1 and may be included in the control unit.

The drive electrodes Tx extend in a second direction Y and are disposed side by side in a first direction X. The detection electrodes Rx extend in the first direction X and are disposed side by side in the second direction Y. However, although details will be described later, the drive electrode Tx has a configuration in which the drive electrode Tx bends along a third direction and a fourth direction intersecting with each other on an X-Y plane while extending in the second direction Y. In addition, the detection electrode Rx has a configuration in which the detection electrode Rx bends along a fifth direction and a sixth direction intersecting with each other on the X-Y plane while extending in the first direction X.

The drive electrode driver TDV supplies a drive signal to the drive electrode Tx. At an intersection between the drive electrode Tx to which the drive signal is supplied and the detection electrode Rx, electrostatic capacitance is formed through an insulating layer. When an object such as a finger comes into contact with or approaches, the electrostatic capacitance changes due to uneven parts (fingerprints) of the finger surface. In response to such a change in the electrostatic quantity, a detection signal is output from the detection electrode Rx to the detection electrode driver RDV. As described above, the fingerprints are detected by the detection device IPD.

In addition, the drive electrode driver TDV simultaneously applies the same drive signal to a plurality of drive electrodes Tx, i.e., the drive electrodes Tx are bundled and driven, and thus it is possible to detect not only fine uneven parts such as fingerprints but also contact or approach of the finger itself. Note that in the present embodiment, although the finger and the fingerprints are taken as examples of an object and fine uneven parts, the present invention is applicable to any object that comes to contact with and approaches and has fine uneven parts.

FIG. 2 is a partially enlarged view of the sensor region SA of the detection device IPD of FIG. 1. The drive electrode Tx shown in FIG. 2 includes a first region TxA extending in a third direction D3, a second region TxB extending in a fourth direction D4, and a first connector TxC connecting the first region TxA to the second region TxB. The first region TxA and the second region TxB are electrodes continuous through the first connector TxC, and extend in the second direction Y as a whole. In other words, the drive electrode Tx is an electrode bending zigzag in the third direction D3 and the fourth direction D4 intersecting with each other, and extends in the second direction Y as a whole.

The detection electrode Rx shown in FIG. 2 includes a third region RxA extending in a fifth direction D5, a fourth region RxB extending in a sixth direction D6, and a second connector RxC connecting the third region RxA to the fourth region RxB. The third region RxA and the fourth region RxB are electrodes continuous through the second connector RxC, and extend in the first direction X as a whole. In other words, the detection electrode Rx is an electrode bending zigzag in the fifth direction D5 and the sixth direction D6 intersecting with each other, and extends in the first direction X as a whole.

Note that in the drive electrodes Tx disposed side by side in the first direction X, two adjacent drive electrodes Tx are disposed in line symmetry to the second direction Y. In addition, in the detection electrodes Rx disposed side by side in the second direction Y, two adjacent detection electrodes Rx may be disposed in line symmetry to the first direction X.

Note that in the present specification, the third direction D3 and the fourth direction D4 are a direction intersecting at an acute angle θ clockwise to the second direction Y and a direction intersecting at an acute angle θ counterclockwise to the second direction Y. In addition, the fifth direction D5 and the sixth direction D6 are a direction intersecting at an acute angle φ clockwise to the first direction X and a direction intersecting at an acute angle φ counterclockwise to the first direction X. The acute angles θ and φ may be different from each other or may be the same.

In addition, the first direction X and the second direction Y may be referred to as directions D1 and D2, respectively.

The detection device IPD shown in FIG. 2 includes a dummy electrode DMY. The dummy electrode DMY is formed of the same material as the drive electrode Tx and in the same process. Note that in the present specification, layers formed of the same material and in the same process are referred to as the same layer. That is, the drive electrode Tx and the dummy electrode DMY are in the same layer.

In addition, the dummy electrode DMY is an electrode piece that is not electrically connected to other electrodes and wiring lines, and is electrically in a floating state.

The dummy electrode DMY includes a dummy electrode DMYA whose longitudinal direction extends along the fifth direction D5 and a dummy electrode DMYB whose longitudinal direction extends along the sixth direction D6. Note that for easy understanding the following description, a direction in which the longitudinal direction of the dummy electrode DMY (DMYA and DMYB) extends is defined as a direction in which the dummy electrode DMY extends.

Two dummy electrodes DMYA, which extend along the fifth direction D5 and are adjacent to each other, are opposed to each other with one first region TxA interposed between the dummy electrodes DMYA. The dummy electrode DMYA extending along the fifth direction D5 is disposed on the extension of one third region RxA.

Two dummy electrodes DMYB, which extend in the sixth direction D6 and are adjacent to each other, are opposed to each other with one second region TxB interposed between the dummy electrodes DMYB. The dummy electrode DMYB extending along the sixth direction D6 is disposed on the extension of one fourth region RxB.

The detection device IPD shown in FIG. 2 has a projection PS projecting in a normal direction Z. The projection PS has a shape having a long side and a short side in a planar view, and has a substantially parallelogram shape in a planar view in FIG. 2. Note that although the above-described "substantially parallelogram shape" means a parallelogram as a design idea, the parallelogram includes variations more or less in shape due to manufacturing processes because it is difficult to manufacture an ideal parallelogram.

The projection PS includes a projection PSA whose longitudinal direction (direction in which the long side extends) extends in the fifth direction D5 and a projection PSB whose longitudinal direction extends in the sixth direction D6. In other words, the longitudinal direction of the projection PSA matches the direction in which the third region RxA of the detection electrode Rx extends. The longitudinal direction of the projection PSB matches the direction in which the fourth region RxB of the detection electrode Rx extends. That is, the longitudinal direction of the projection PS matches the direction in which the detection electrode Rx bends in directions different from each other.

Although details will be described later, the longitudinal direction of the projection PS is matched with the direction in which the detection electrode Rx extends, and thus the reflection stripe due to the projection PS can overlap the reflection stripe due to the detection electrode Rx. As a result, since the number of reflection stripes can be reduced, the visibility of the detection device IPD is improved.

Note that in the projection PSA, preferably, the lateral direction (direction in which the short side extends) also extends in the sixth direction D6. In addition, also in the projection PSB, the lateral direction preferably extends in the fifth direction D5. The configuration in which the shorter side of the projection PSA and the short side of the projection PSB extend in the sixth direction D6 and the fifth direction D5, respectively, will be described in detail later.

However, the present invention is not limited to the above in the case in which the short sides of the projections PSA and PSB are short enough not to affect visibility. That is, in the case in which the reflection stripes due to the short sides of the projection PSA and the projection PSB are negligibly small, the short sides may not extend in the sixth direction D6 and the fifth direction D5.

In FIG. 2, the projection PS is provided, for example, in a first enclosed region RG1 surrounded by any one of the dummy electrodes DMYA and DMYB, the first region TxA and the second region TxB, and any one of the third region RxA and the fourth region RxB, in a second enclosed region RG2 surrounded by two dummy electrodes DMYA and DMYB, the first region TxA and the second region TxB, and in a third enclosed region RG3 surrounded by the first region TxA and the second region TxB, and the third region RxA and the fourth region RxB.

Note that the position at which the projection PS is provided is not limited to the above. The projection PS only has to be provided in a region formed using two sets of two electrode pieces parallel to each other among the dummy electrode DMYA, the dummy electrode DMYB, the first region TxA, the second region TxB, the third region RxA, and the fourth region RxB. The region formed using two sets of the two parallel electrode pieces is, for example, a rhombic region. Note that the rhombic shape is also a so-called "substantially rhombic shape" including variations more or less in shape due to manufacturing processes.

Note that in the present specification, in addition to the detection electrode Rx and the drive electrode Tx, the dummy electrode DMY may also be referred to as a sensor electrode. The dummy electrode DMY is in a floating state as described above. However, the dummy electrode DMY is referred to as a sensor electrode for convenience in the present specification. Therefore, it can be said that the projection PS of the present embodiment is disposed in a parallelogram-shaped region formed by the sensor electrode.

The projection PS is disposed apart from the detection electrode Rx in a planar view. That is, the projection PS does not overlap the detection electrode Rx. Although details will be described later, this is because when the projection PS overlaps the detection electrode Rx, at the time of applying a pressing force to the projection PS, the pressing force is applied to the overlapping detection electrode Rx, and the detection electrode Rx may be broken.

For the same reason, preferably, the projection PS is disposed apart from the drive electrode Tx, i.e., the projection PS does not overlap the drive electrode Tx.

Figure 3A:
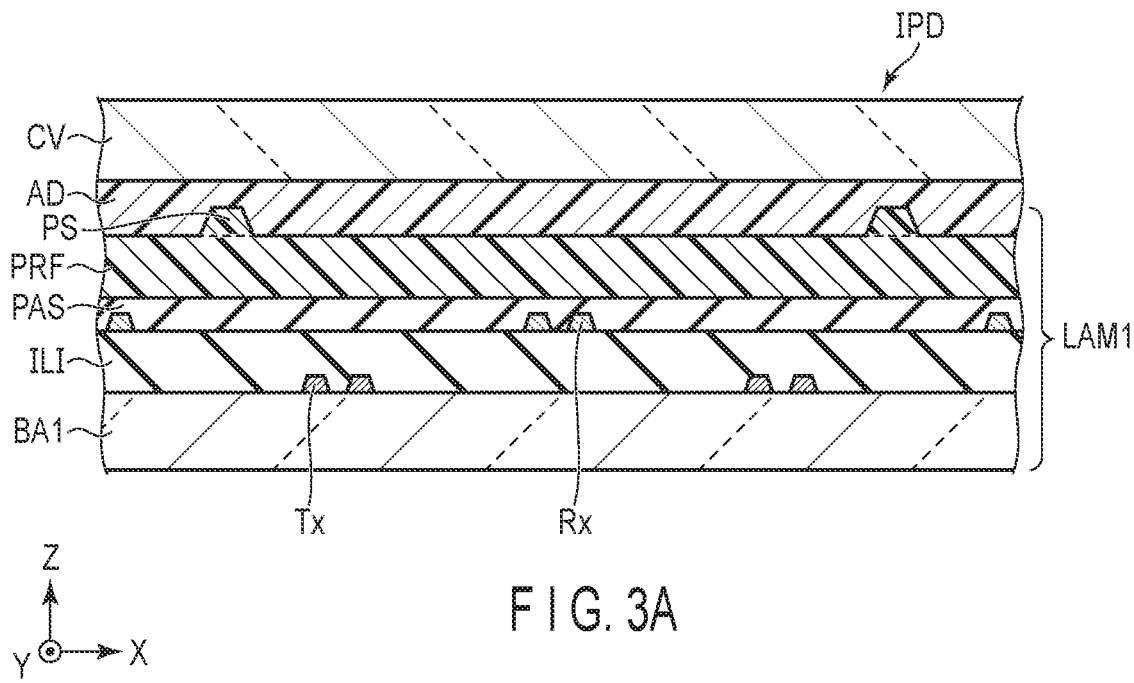
FIG. 3A is a cross-sectional view of a detection device IPD of the present embodiment.
Figure 3B:
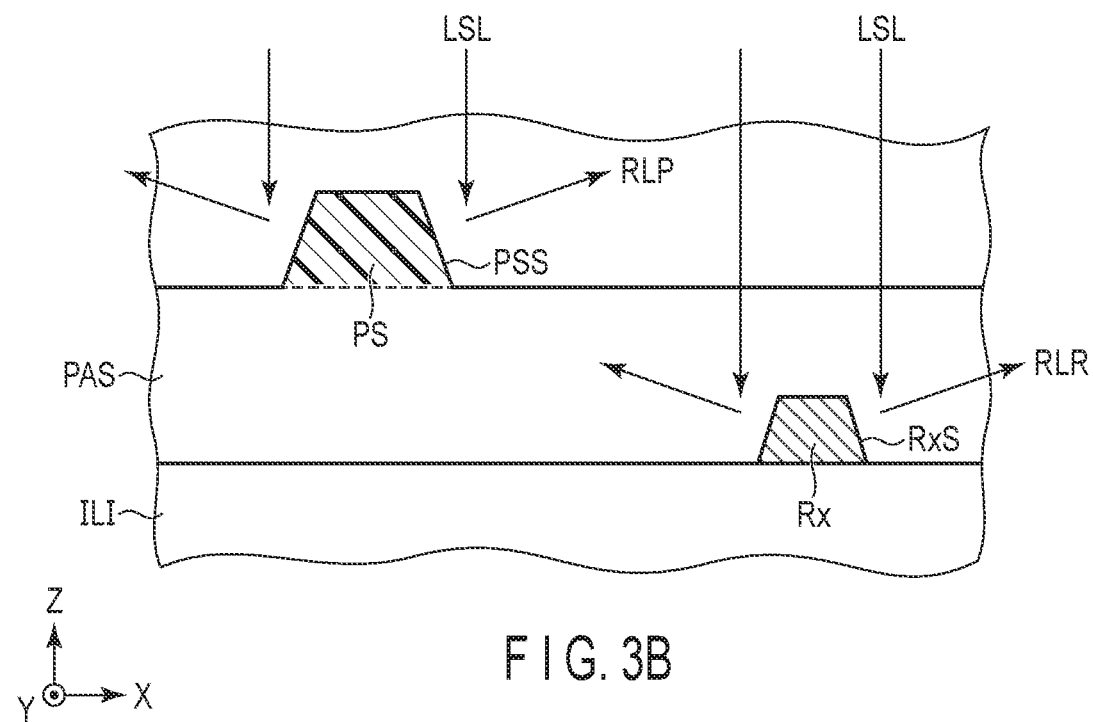
FIG. 3B is a cross-sectional view of the detection device IPD of the present embodiment.

FIGS. 3A and 3B are cross-sectional views of the detection device IPD of the present embodiment. Specifically, FIG. 3A is a cross-sectional view taken along line III-III of the detection device IPD shown in FIG. 2. FIG. 3B is an enlarged cross-sectional view of FIG. 3A. In the detection device IPD shown in FIG. 3A, a base BA1, the drive electrode Tx, an insulating layer ILI, the detection electrode Rx, an insulating layer PAS, an insulating layer PRF, the projection PS, an adhesive AD, and a cover member CV are stacked in this order along the normal direction Z. Note that a stacked layer body including the base BA1, the drive electrode Tx, the insulating layer ILI, the detection electrode Rx, the insulating layer PAS, the insulating layer PRF, and the projection PS is referred to as a stacked layer body LAM1.

Note that an insulating layer may be further provided between the base BA1 and the drive electrode Tx.

The base BA1 is a glass base having translucency. Alternatively, the base BA1 may be a resin base having translucency. Examples of the resin base used for the base BA1 include polyimide and acrylic.

The insulating layer ILI is formed of an insulating material having translucency. The insulating layer ILI is formed of, for example, an organic insulating material such as acrylic or polyimide. Alternatively, the insulating layer ILI may be formed using an inorganic insulating material.

The insulating layer ILI is disposed covering the drive electrode Tx, insulates the drive electrode Tx from the detection electrode Rx, and functions as a dielectric layer between the drive electrode Tx and the detection electrode Rx.

The insulating layer PAS is formed using, for example, an inorganic insulating material such as silicon oxide, silicon nitride, or silicon oxynitride. Such an inorganic insulating material blocks moisture mixed from outside. Specifically, the insulating layer PAS formed covering the detection electrode Rx is preferably formed of an inorganic insulating material that blocks moisture from the viewpoint of preventing the corrosion of the detection electrode Rx.

In addition, in the case in which the insulating layer ILI is formed using an inorganic insulating material, the insulating layer PAS and the insulating layer ILI may be formed using the same material, or may be formed using different types of inorganic insulating materials.

The insulating layer PRF is formed of an insulating material having translucency. The insulating layer PRF is formed of, for example, an organic insulating material such as acrylic or polyimide.

Note that in the case in which the insulating layer ILI is formed of an organic insulating material, the insulating layer ILI and the insulating layer PRF may be formed of the same material, or may be formed of different types of organic insulating materials.

The projection PS may be made of the same material as the insulating layer PRF or an organic insulating material different from the insulating layer PRF. In the case in which the projection PS is made of the same material as the insulating layer PRF, the projection PS may be formed by forming a film of an organic insulating material to be the projection PS and the insulating layer PRF and half-exposing the organic insulating material. More specifically, the projection PS and the insulating layer PRF may be formed using an acrylic resin material.

The adhesive AD bonds the insulating layer PRF to the cover member CV. In addition, the adhesive AD is an adhesive or resin having translucency, and transmits visible light. As a material of the adhesive AD, for example, an adhesive resin material having translucency such as Optical Clear Adhesion (OCA) may be used.

The adhesive AD is preferably formed of a material having a refractive index equivalent to that of the projection PS. In addition, when the projection PS is made of the same material as the insulating layer PRF, the adhesive AD preferably has the same refractive index as the insulating layer PRF. Since the refractive index is equivalent to that of the adhesive AD, the projection PS, and further the insulating layer PRF, the projection PS is hardly visually recognized from the outside, and the visibility of the entire detection device IPD is improved.

The cover member CV is a member that protects the surface of the sensor region SA of the detection device IPD, and covers the sensor region SA. The cover member CV is formed using, for example, a glass substrate or a resin substrate.

The drive electrode Tx and the detection electrode Rx are formed of, for example, a metal material such as aluminum, titanium, silver, molybdenum, tungsten, copper, or chromium, or an alloy obtained by combining these metal materials.

For example, as the detection electrode Rx, a stacked layer body in which molybdenum, aluminum, and molybdenum are stacked in this order may be formed. In addition, as the drive electrode Tx, a stacked layer body in which titanium, aluminum, and titanium are stacked in this order may be formed.

As described above, the detection electrode Rx has a configuration in which the detection electrode Rx bends zigzag in the fifth direction D5 and the sixth direction D6. Further, the detection electrode Rx is disposed above the drive electrode Tx.

In such a detection device IPD, in the case in which light is applied from above, the light is reflected off the side surface of the detection electrode Rx, and the reflected light is sometimes visually recognized as a stripe.

As shown in FIG. 3B, in the case in which the detection device IPD is applied with light LSL from a light source located above, the light LSL is reflected off a side surface RxS of the detection electrode Rx and a side surface PSS of the projection PS. The light reflected on the side surface RxS is light RLR and the light reflected on the side surface PSS is reflected light RLP. The reflected light RLR extends along the X-Y plane according to the fifth direction D5 and the sixth direction D6, which are bending directions of the detection electrode Rx on the X-Y plane. The reflected light RLP extends along the X-Y plane according to the fifth direction D5 and the sixth direction D6, which are extending directions of the projection PS on the X-Y plane.

Figure 4:
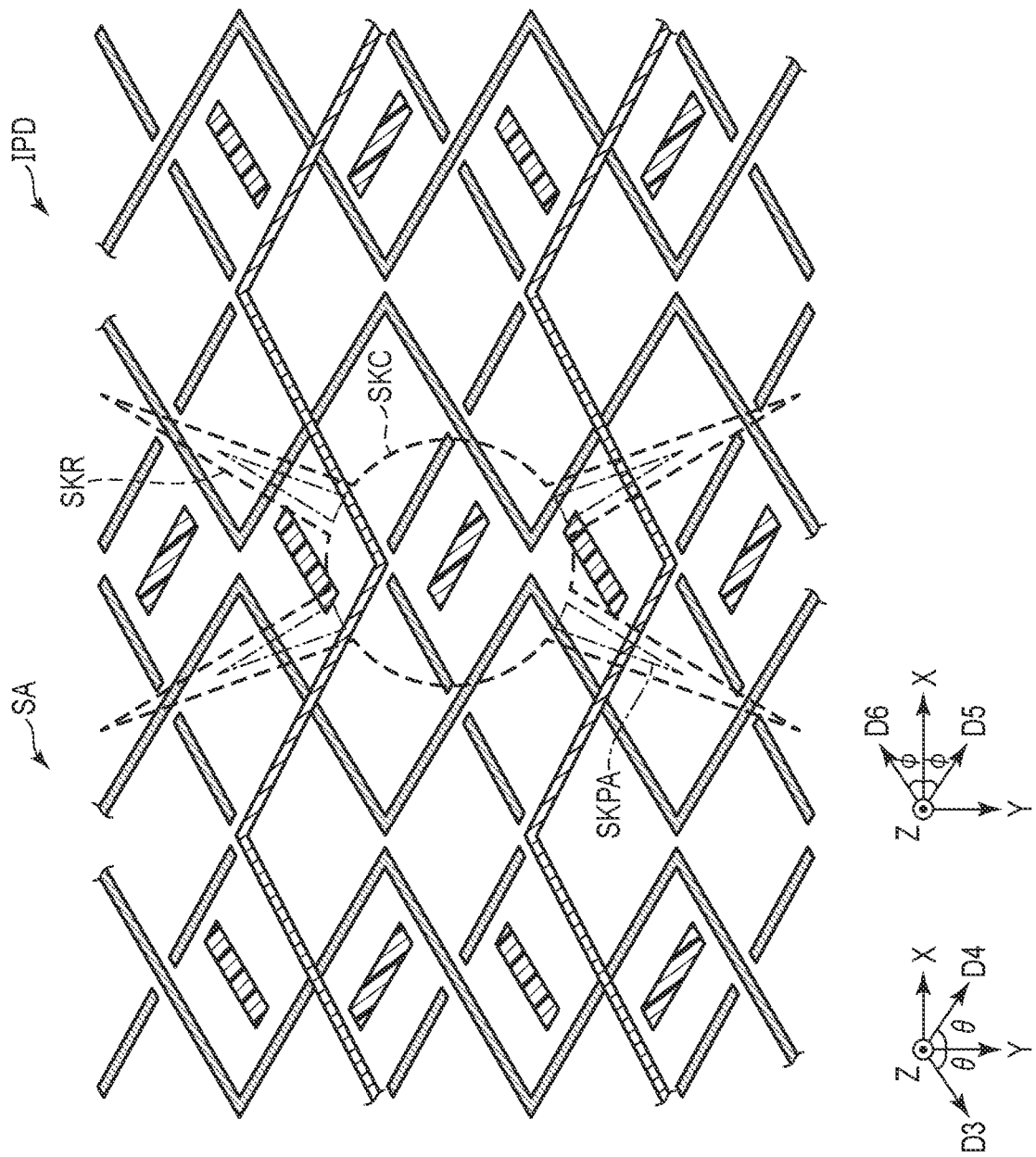
FIG. 4 is a plan view showing reflected light in the case in which the detection device IPD of the embodiment is applied with light LSL.
Figure 5:
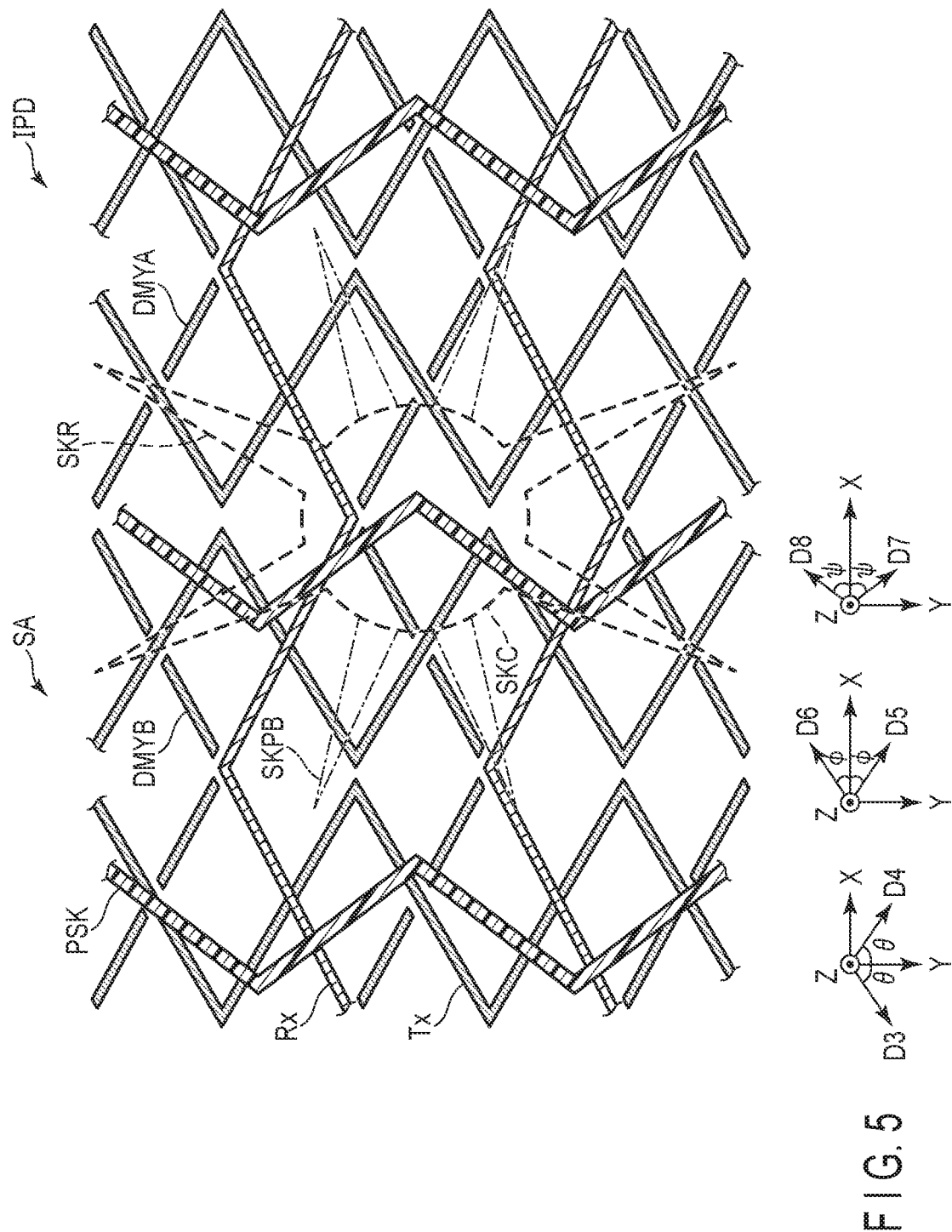
FIG. 5 is a plan view showing reflected light in the case in which a projection bends in a direction different from a detection electrode Rx.

FIG. 4 is a plan view showing reflected light in the case in which the detection device IPD of the embodiment is applied with the light LSL. On the other hand, FIG. 5 is a plan view showing reflected light in the case in which the projection bends in a direction different from the detection electrode Rx. Note that in FIG. 5, the configuration other than the configuration of the projection PSK is similar to that in FIG. 4. Therefore, FIG. 4 is referenced for the detailed description, and details are omitted.

As shown in FIG. 4, the reflected light of the present embodiment includes a reflective region SKC in which the light LSL is directly reflected off the base BA1 or/and the cover member CV, and four reflective regions SKR extending from the reflective region SKC. The reflective region SKR is due to reflection on the side surface RxS of the detection electrode Rx as described above. The four reflective regions SKR extend according to the bending directions of the detection electrode Rx. That is, the reflective regions SKR extend according to the fifth direction D5, the sixth direction D6, a direction opposite to the fifth direction D5, and a direction opposite to the sixth direction D6.

On the other hand, as shown in FIG. 5, the case in which the projection bends in a direction different from the detection electrode Rx is considered. In the detection device IPD shown in FIG. 5, the projection PSK bends zigzag in a seventh direction D7 and an eighth direction D8, and extends in the second direction Y as a whole.

Note that the seventh direction D7 and the eighth direction D8 are a direction intersecting at an acute angle ψ clockwise to the first direction X and a direction intersecting an acute angle ψ counterclockwise to the first direction X. The acute angles ψ and φ are different from each other.

The reflected light having the configuration shown in FIG. 5 includes four reflective regions SKPB in addition to the reflective region SKC and the four reflective regions SKR in FIG. 4. The reflective region SKPB is due to reflection on the side surface of the projection PSK. The four reflective regions SKPB extend according to the bending directions of the projection PSK. That is, the reflective region SKPB extends according to the seventh direction D7, the eighth direction D8, a direction opposite to the seventh direction D7, and a direction opposite to the eighth direction D8.

That is, in the case in which the projection PS bends zigzag as with the detection electrode Rx, there is a possibility that the reflection stripe due to the projection PS is visually recognized in addition to the reflection stripe due to the detection electrode Rx. Such an increase in reflection stripes degrades the visibility of the detection device IPD.

Here, referring back to FIG. 4, reflected light in the detection device IPD of the present embodiment will be described. Also in the detection device IPD of the present embodiment, the reflected light includes a reflective region SKPA due to the longitudinal direction of the projection PS.

However, the reflective region SKPA overlaps the reflective region SKR due to the detection electrode Rx in a planar view. This is because the bending direction of the detection electrode Rx matches the longitudinal direction of the projection PS. For this reason, the reflective region SKPA is not visually recognized, and an increase in reflection stripes is suppressed. In other words, as compared with the configuration shown in FIG. 5, the reflection stripe is reduced in the detection device IPD of the present embodiment. Accordingly, the visibility of the detection device IPD is improved.

Returning back to FIG. 3A, the positional relationship between the projection PS and the detection electrode Rx will be described. As shown in FIG. 3A, in the detection device IPD of the present embodiment, the projection PS does not overlap the detection electrode Rx. In other words, the projection PS is formed avoiding the detection electrode Rx.

Here, in the manufacturing process of the detection device IPD, there is a process in which after the projection PS is formed, two stacked layer bodies LAM1 formed with the projection PS are bonded together, and the base BA1 is slimmed. In this slimming process, the projection PS functions as a spacer that maintains the interval between the stacked layer bodies LAM1.

Figure 6:
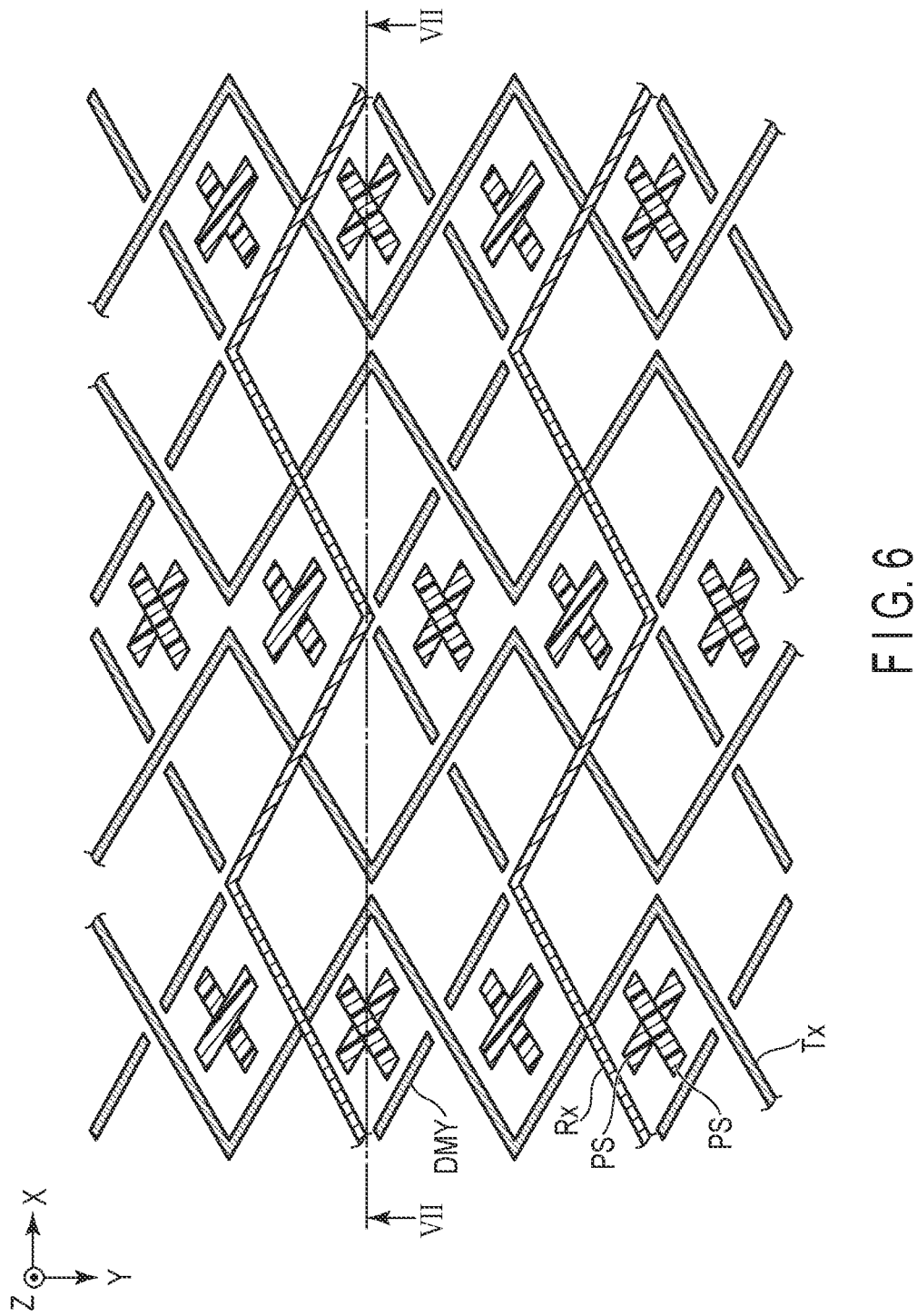
FIG. 6 is a plan view of a configuration in which two stacked layer bodies LAM1 are bonded together in the embodiment.
Figure 7:
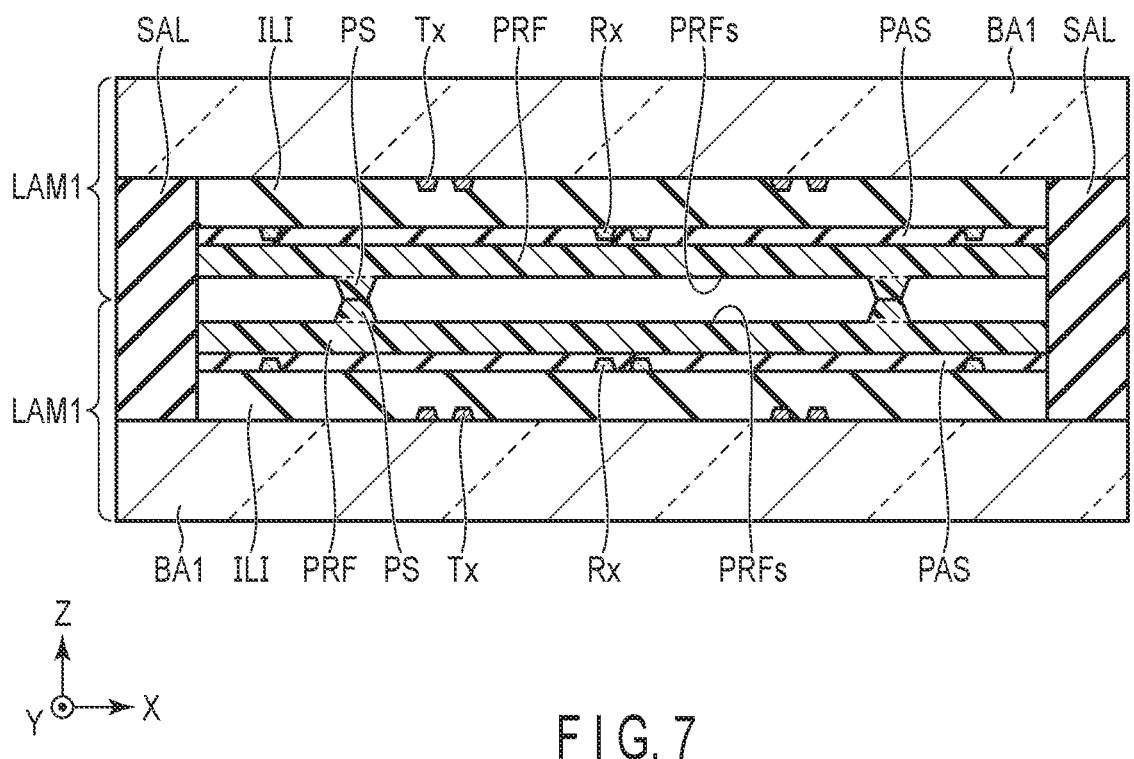
FIG. 7 is a cross-sectional view of two stacked layer bodies LAM1 taken along line VII-VII in FIG. 6.

FIG. 6 is a plan view of a configuration in which two stacked layer bodies LAM1 are bonded together in the embodiment. FIG. 7 is a cross-sectional view of the two stacked layer bodies LAM1 taken along line VII-VII in FIG. 6.

As shown in FIGS. 6 and 7, the projections PS overlap each other to maintain the interval between the stacked layer bodies LAM1. The projection PS is provided, it is possible to suppress the occurrence of scratches due to the contact between the surfaces of the stacked layer body LAM1, i.e., the surfaces PRFs of the insulating layers PRF.

In addition, a sealing material SAL is provided at the end portions of the two bases BA1 to prevent an etchant in the slimming process from entering the inside of the stacked layer body LAM1.

As shown in FIGS. 6 and 7, in the configuration in which the projection PS does not overlap the detection electrode Rx, no pressing force is applied to the detection electrode Rx even though a pressing force is applied to the projection PS. Therefore, the breaking of the detection electrode Rx can be suppressed.

Further, in the configuration shown in FIGS. 6 and 7, the projection PS does not overlap the drive electrode Tx either. Therefore, in the configuration of the present embodiment, the breaking of the drive electrode Tx can also be suppressed in addition to the detection electrode Rx.

Figure 8:
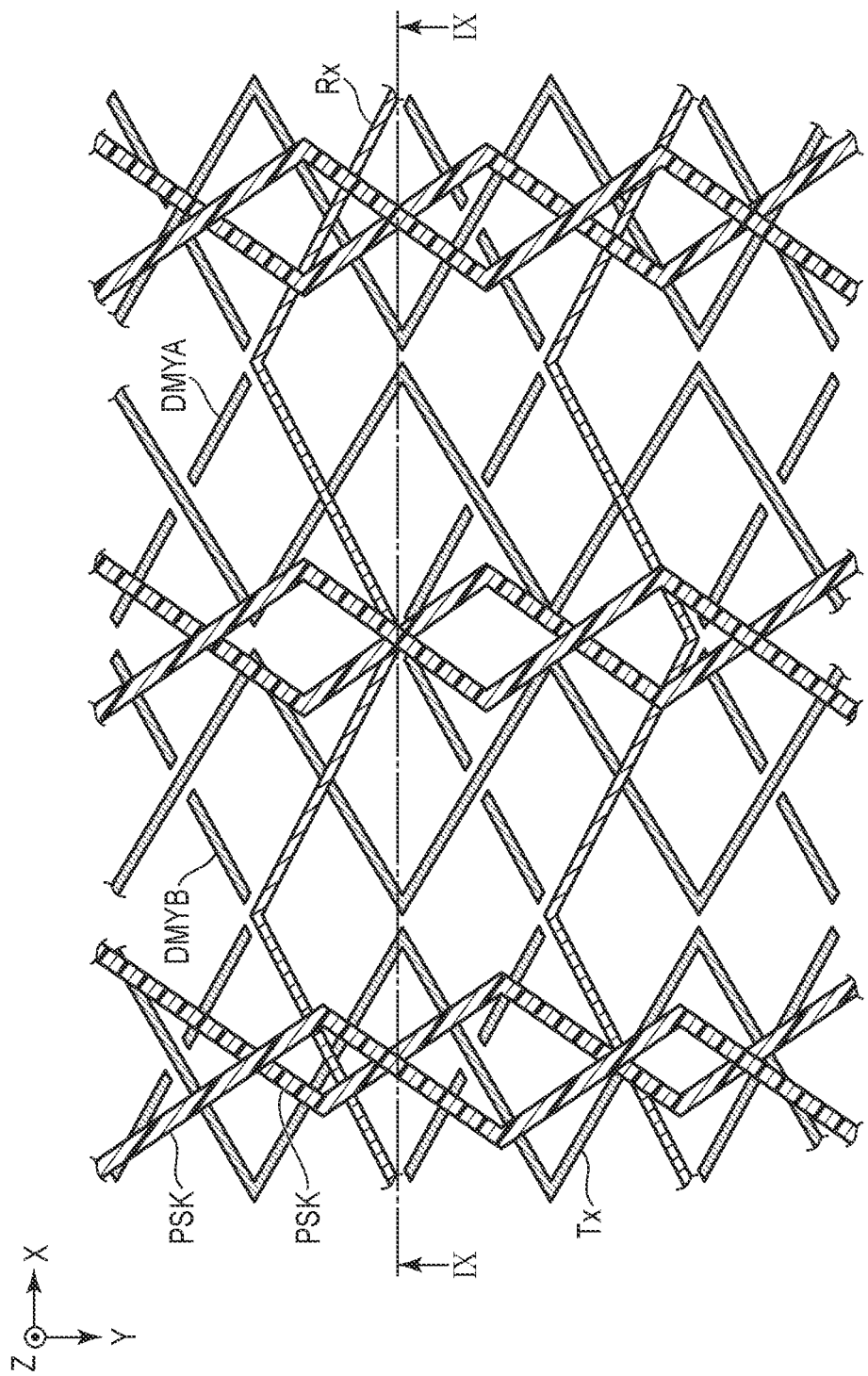
FIG. 8 is a plan view of a configuration in which two stacked layer bodies LAM2 are bonded together in the case in which a projection PSK bends in a direction different from the detection electrode Rx.
Figure 9:
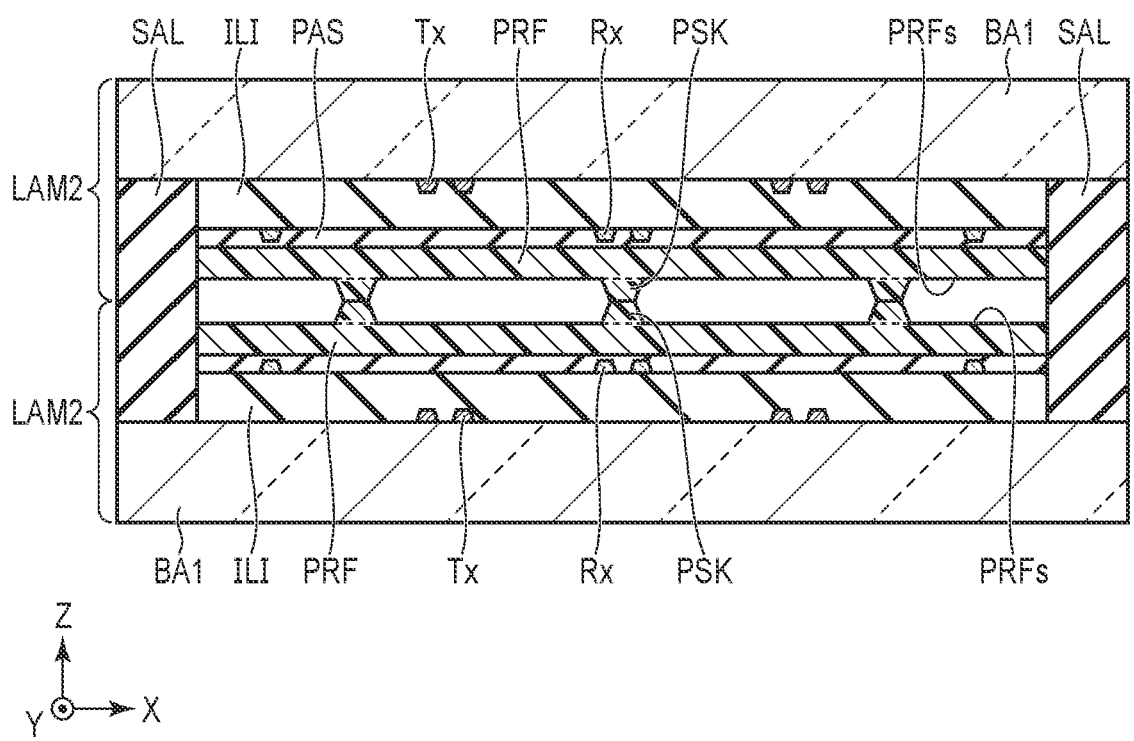
FIG. 9 is a cross-sectional view of two stacked layer bodies LAM2 taken along line IX-IX in FIG. 8.

On the other hand, in the configuration in which the projection bends in a direction different from the detection electrode Rx as shown in FIG. 5, the case in which the two stacked bodies are bonded is considered. FIG. 8 is a plan view of a configuration in which two stacked layer bodies LAM2 are bonded together in the case in which the projection PSK bends in a direction different from the detection electrode Rx. FIG. 9 is a cross-sectional view of two stacked layer bodies LAM2 taken along line IX-IX in FIG. 8.

As shown in FIGS. 8 and 9, one stacked layer body LAM2 includes the base BA1, the drive electrode Tx, the insulating layer ILI, the detection electrode Rx, the insulating layer PAS, the insulating layer PRF, and the projection PSK.

As shown in FIGS. 8 and 9, the projection PSK overlaps the detection electrode Rx. When a pressing force is applied from the upper surfaces of the two stacked layer bodies LAM2, the pressure on the projection PSK increases. When the pressure on the projection PSK increases, the detection electrode Rx and the drive electrode Tx overlapping on the projection PSK might be pressed by the projection PSK and broken.

Further, when the projection PSK presses the overlapping detection electrode Rx, a pressure is applied to the insulating layer PRF in the vicinity of the projection PSK and the insulating layer ILI and the insulating layer PAS in the vicinity of the detection electrode Rx, and there is a possibility that a crack occurs in the insulating layer. When moisture enters the generated crack, the metal material of the detection electrode Rx is corroded by the moisture. Even in such a case, the detection electrode Rx might be broken.

However, in the present embodiment, as shown in FIGS. 6 and 7, the projection PS does not overlap the detection electrode Rx, and the detection electrode Rx is not directly broken by the pressure from the projection PS. In addition, since the projection PS does not overlap the detection electrode Rx, the pressure of the projection PS is not transmitted to the insulating layer PRF or the insulating layer ILI through the detection electrode Rx. Therefore, the occurrence of cracks in the insulating layer PRF, the insulating layer ILI, and the insulating layer PAS can be suppressed. As a result, it is possible to suppress the corrosion of the detection electrode Rx due to moisture. Since the detection electrode Rx is not corroded and not broken, the electrical reliability of the detection device IPD can be improved.

Note that although the case in which the detection electrode Rx does not overlap the projection PS has been described, preferably, the drive electrode Tx does not overlap the projection PS as well.

In the case in which the projection PS overlaps the drive electrode Tx, the projection PS might push the drive electrode Tx to cause a crack in the insulating layer PAS or the insulating layer ILI between the projection PS and the drive electrode Tx. As a result, the drive electrode Tx might be corroded and broken. Therefore, preferably, the projection PS does not overlap the drive electrode Tx.

As described above, in the detection device of the present embodiment, the reflection stripe is reduced. Therefore, it is possible to improve the visibility of the detection device.

In addition, in the detection device of the present embodiment, it is possible to prevent the electrode and the wiring line from breakage due to corrosion. Therefore, according to the present embodiment, it is possible to improve the reliability of the detection device.

Configuration Example 1

FIG. 10 is a cross-sectional view showing a display device having a detection function according to the embodiment. In addition to a display function of displaying an image, a display device DSP according to the present configuration example has a detection function of detecting approach or contact of the object OBJ and fine uneven parts (for example, fingerprints) of the surface. The display device DSP includes a display panel PNL, the detection device IPD of the embodiment, circuit boards FPCD and FPCT, and the like.

Note that in FIG. 10, the description of the same components as the reference numerals described above is referenced to the embodiments, and details are omitted.

The display device DSP shown in FIG. 10 is a display device equipped with a detection function, and includes a display region AA on which images are displayed, a sensor region SA, and a frame area FR.

In the display device DSP shown in FIG. 10, the display region AA matches or substantially matches the sensor region SA, and fine uneven parts such as fingerprints can be detected on the entire surface of the display region AA. The display region AA and the sensor region SA have, for example, a rectangular shape in a planar view.

As shown in FIG. 10, the display device DSP includes a display panel PNL and a detection device IPD. As described above, the detection device IPD includes a stacked layer body LAM1, a cover member CV, and an adhesive AD that bonds the stacked layer body LAM1 to the cover member CV.

The cover member CV has a first surface CVsa and a second surface CVsb opposite to the first surface CVsa. The first surface CVsa of the cover member CV is a detection surface that detects the uneven parts of the surface of the object OBJ or the like that comes into contact with or approaches to the first surface CVsa, and a display surface on which the observer visually recognizes the image of the display panel PNL.

Note that the configuration of the detection device IPD and the display panel PNL including the cover member CV is not limited to the rectangular shape in a planar view, and may be a configuration having different shapes in which the outer shape of a circular shape, an oval shape, or an irregular shape of which those shapes are partially omitted. In addition, the cover member CV is not limited to a flat plate shape. For example, in the case in which the display region AA and the sensor region are formed of curved surfaces or the frame area FR is formed of a curved surface curved toward the display panel PNL, the cover member CV may have a curved surface.

In addition, in the frame area FR, a decorative layer DCF is provided on the second surface CVsb of the cover member CV. The decorative layer DCF is a colored layer having a light transmittance lower than that of the cover member CV. The decorative layer DCF can suppress the visible recognition of the wiring line, the circuit, and the like provided to overlap the frame area FR by the observer. In the example shown in FIG. 10, the decorative layer DCF is provided on the second surface CVsb. However, the decorative layer DCF may be provided on the first surface CVsa. In addition, the decorative layer DCF is not limited to a single layer, and may have a configuration in which a plurality of layers is stacked.

The detection device IPD is the detection device IPD described in the embodiment. The detection device IPD is located on the display panel PNL, and is bonded to the display panel PNL with an adhesive ADb. In the shown example, the detection device IPD is bonded to a polarizer PLPb of the display panel PNL. At one end portion of the detection device IPD, a circuit board FPCT is connected. Various signals that drive the detection device IPD are supplied from an external device through the circuit board FPCT. The various signals supplied from the external device are applied to the drive electrode driver TDV and the detection electrode driver RDV through the circuit board FPCT, and further applied to the drive electrode Tx and the detection electrode Rx.

As described in the embodiment, the adhesive AD is an adhesive or resin having translucency, and transmits visible light. In addition, the adhesive ADb is an adhesive or a resin having translucency. It is preferable to use the same material as the adhesive AD and the adhesive ADb. However, the adhesive AD and the adhesive ADb may be different materials as long as the adhesive AD and the adhesive ADb transmit visible light.

The display panel PNL is, for example, a liquid crystal display panel. The display panel PNL includes a substrate SUBa, a substrate SUBb, a liquid crystal layer LQ, polarizers PLPa and PLPb, and the like. The substrate SUBa and the substrate SUBb are opposed to each other. The liquid crystal layer LQ is held between the substrate SUBa and the substrate SUBb. The polarizer PLPa and the polarizer PLPb sandwich the substrate SUBa, the substrate SUBb, and the liquid crystal layer LQ. At one end portion of the display panel PNL, a circuit board FPCD is connected. Various signals that drive the display panel PNL are supplied from an external device through the circuit board FPCD.

Note that the display panel PNL is not limited to the liquid crystal display panel, and may be an organic electro luminescence (EL) display panel, a micro LED display panel, or the like. Note that in the present configuration example, the micro LED refers to an LED (light-emitting diode) in which the length of the longest side is 100 μm or less.

In the display device DSP equipped with a detection function of the present configuration example, the detection device IPD is stacked on the display panel PNL. The image of the display panel PNL is displayed on the first surface CVsa of the cover member CV through the detection device IPD.

For this reason, in the display device DSP having the projection PS described in the first embodiment, since the visibility of the detection device IPD is improved, there is an advantage that the visibility of the entire display device DSP is also improved.

In addition, in the display device DSP of the present configuration example, even in the case in which stress is applied to the projection PS during the manufacturing process, it is possible to suppress the occurrence of cracks in the insulating layer PRF, the insulating layer ILI, and the insulating layer PAS, and to suppress the corrosion of the detection electrode Rx. As a result, the electrical reliability of the entire display device DSP can be improved.

The display device DSP equipped with a detection function described in the present configuration example can include not only the detection device IPD described in the embodiment but also a detection device IPD of another configuration example described later. Therefore, the display device DSP of the present configuration example can be obtained by referencing the present configuration example also in other configurations described later.

Configuration Example 2

Figure 11:
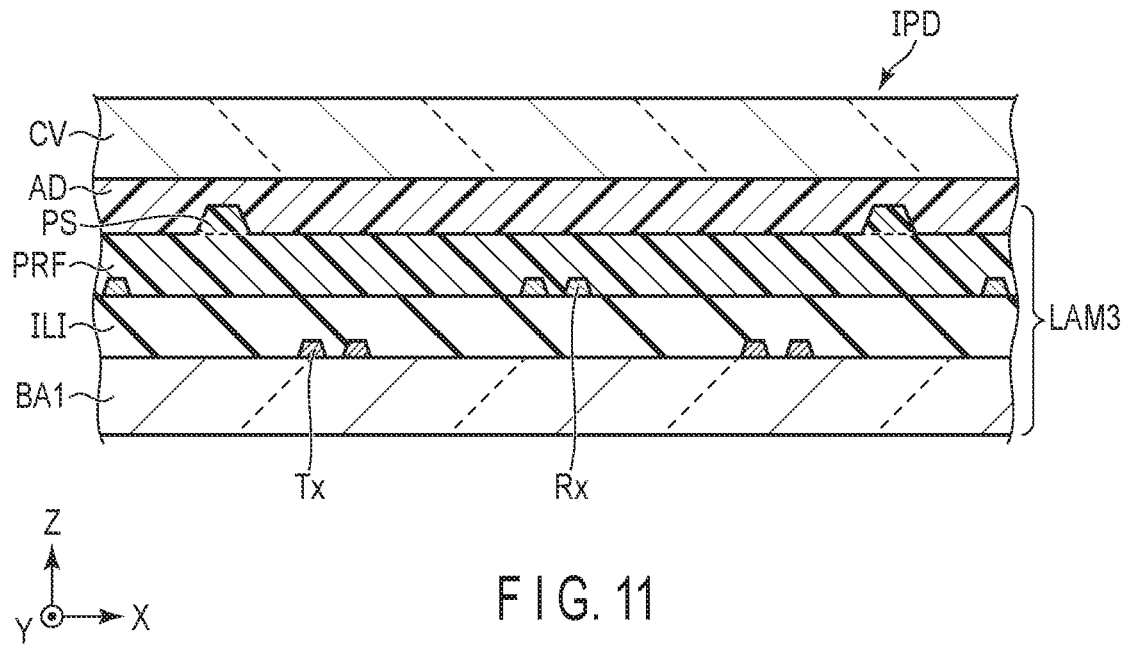
FIG. 11 is a cross-sectional view showing another configuration of the detection device according to the embodiment.

FIG. 11 is a cross-sectional view showing another configuration of the detection device according to the embodiment. The configuration example shown in FIG. 11 is different from the configuration example shown in FIG. 3A in that an insulating layer of an inorganic insulating material is not provided.

In a detection device IPD shown in FIG. 11, a base BA1, a drive electrode Tx, an insulating layer ILI, a detection electrode Rx, an insulating layer PRF, a projection PS, an adhesive AD, and a cover member CV are stacked in this order along the normal direction Z. Note that a stacked layer body including the base BA1, the drive electrode Tx, the insulating layer ILI, the detection electrode Rx, the insulating layer PRF, and the projection PS is referred to as a stacked layer body LAM3.

As shown in the present configuration example, in the configuration in which the insulating layer of the inorganic insulating material (insulating layer PAS in FIG. 3A) is not provided, the manufacturing process can be shortened, and thus it is possible to reduce the manufacturing time and cost.

Also in the present configuration example, since the longitudinal direction of the projection PS matches the bending direction of the detection electrode Rx, the reflection stripe due to the projection PS is not visually recognized. Therefore, the visibility of the detection device IPD and the display device DSP including the detection device IPD is improved.

In addition, also in the present configuration example, since the projection PS is apart from the detection electrode Rx, it is possible to prevent the detection electrode Rx from being broken and to improve reliability of the detection device IPD and the display device.

Configuration Example 3

Figure 12:
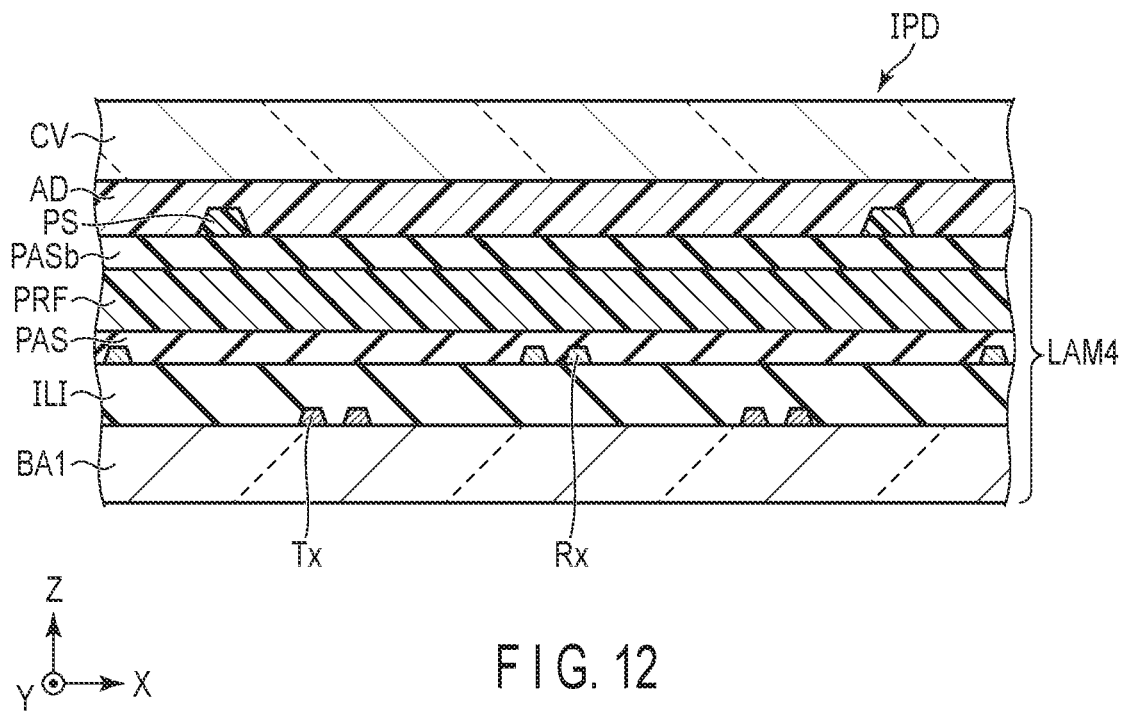
FIG. 12 is a cross-sectional view showing another configuration of the detection device according to the embodiment.

FIG. 12 is a cross-sectional view showing another configuration of the detection device according to the embodiment. The configuration example shown in FIG. 12 is different from the configuration example shown in FIG. 3A in that two insulating layers of an inorganic insulating material are provided.

In a detection device IPD shown in FIG. 12, a base BA1, a drive electrode Tx, an insulating layer ILI, a detection electrode Rx, an insulating layer PAS, an insulating layer PRF, an insulating layer PASb, a projection PS, an adhesive AD, and a cover member CV are stacked in this order along the normal direction Z. Note that a stacked layer body including the base BA1, the drive electrode Tx, the insulating layer ILI, the detection electrode Rx, the insulating layer PAS, the insulating layer PRF, the insulating layer PASb, and the projection PS is referred to as a stacked layer body LAM4.

In FIG. 12, the insulating layer PAS and the insulating layer PASb are insulating layers formed using an inorganic insulating material. Specifically, the insulating layer PAS and the insulating layer PASb are formed using silicon oxide, silicon nitride, silicon oxynitride, or the like. As described above, such an inorganic insulating material blocks moisture from outside. Therefore, in the configuration shown in FIG. 12, it is possible to further prevent moisture from being mixed by the insulating layers PAS and PASb which are two inorganic insulating layers.

Note that in the detection device IPD shown in FIG. 12, the projection PS is disposed on the insulating layer PASb. The projection PS may be made of the same material as or a different material from the insulating layer PRF. For example, the projection PS may be formed using an organic insulating material, more specifically, an acrylic resin material.

In the case in which an acrylic resin material is used as the projection PS, moisture easily penetrates through the acrylic resin, and thus moisture might be mixed into the detection device IPD. However, since the insulating layer PASb in contact with the projection PS blocks moisture, moisture is not mixed into the inside of the detection device IPD, and the corrosion of an electrode formed of a metal material, for example, the detection electrode Rx or the like can be prevented.

Also in the present configuration example, since the longitudinal direction of the projection PS matches the bending direction of the detection electrode Rx, the reflection stripe due to the projection PS is not visually recognized. Therefore, the visibility of the detection device IPD and the display device DSP including the detection device IPD is improved.

In addition, also in the present configuration example, since the projection PS is apart from the detection electrode Rx, it is possible to prevent the detection electrode Rx from being broken and to improve reliability of the detection device IPD and the display device.

Configuration Example 4

Figure 13:
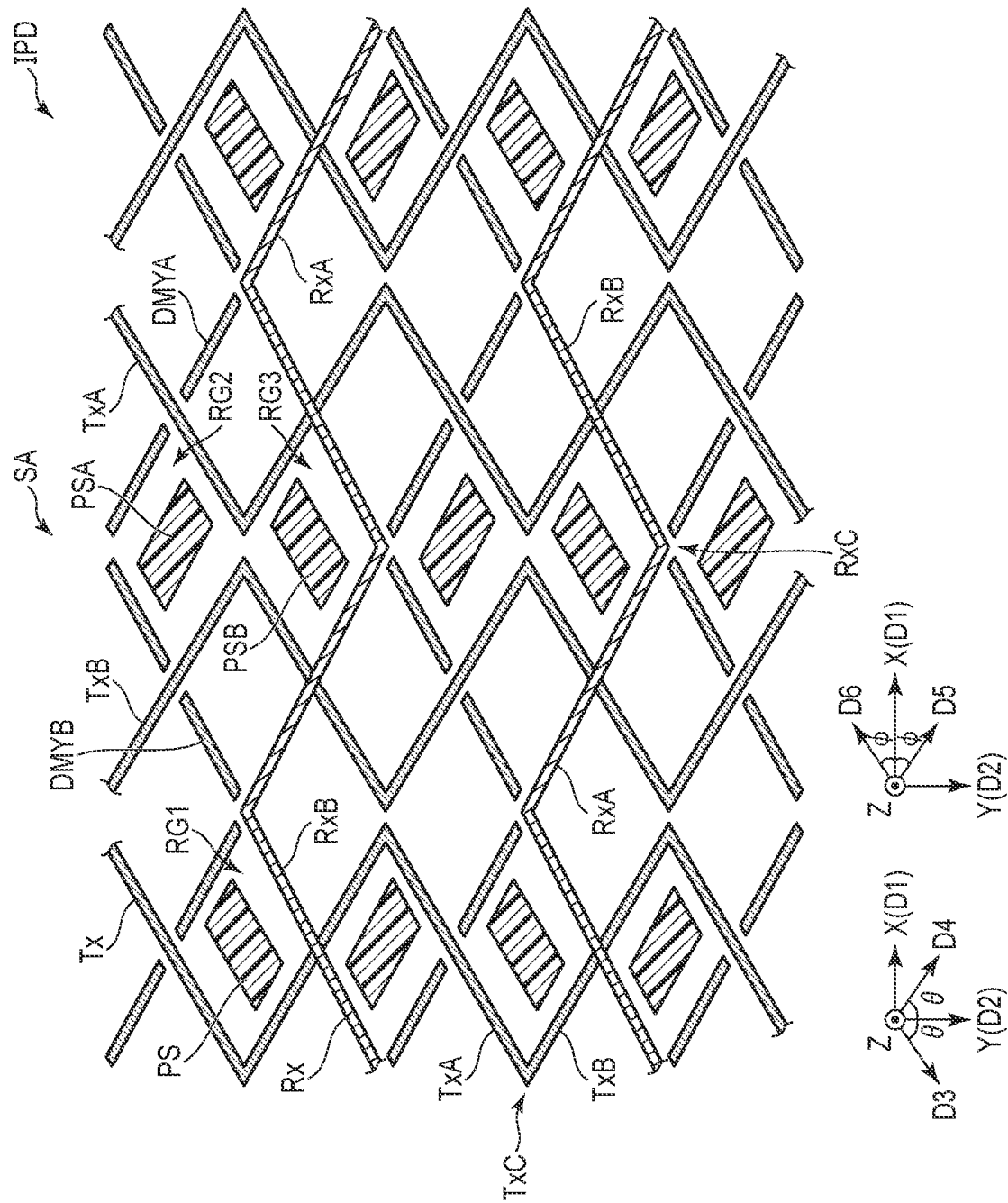
FIG. 13 is a plan view showing another configuration of the detection device according to the embodiment.

FIG. 13 is a plan view showing another configuration of the detection device according to the embodiment. The configuration example shown in FIG. 13 is different from the configuration example shown in FIG. 2 in that the lateral direction of the projection is also parallel to the sensor electrode.

In a detection device IPD shown in FIG. 13, the lateral direction (extending direction of the short side) of a projection PSA extends in the sixth direction D6. In addition, also in a projection PSB, the lateral direction extends in the fifth direction D5. In other words, the lateral directions of the projection PSA and the projection PSB also match the bending direction of the detection electrode Rx.

The long side and short side of the projection PSA and the long side and short side of the PSB are preferably disposed at equal positions of a corresponding first enclosed region RG1 to a third enclosed region RG3, respectively. In other words, preferably, the long side and short side of the projection PSA, and the long side and short side of the PSB are disposed at equal distances from any one of the detection electrode Rx, the dummy electrode DMY, and the drive electrode Tx surrounding the projections PSA and PSB. Further, in other words, the sides of the parallelogram formed by the projection PSA and the projection PSB are disposed at equal distances from the sides of the parallelogram formed by the sensor electrode surrounding the projection PSA and the projection PSB.

As a result, similarly to the long side, even in the case in which a reflection stripe due to the short sides of the projections PSA and PSB occurs, the reflection stripe can be overlapped with the reflection stripe due to the sensor electrode, specifically the detection electrode Rx. Therefore, the visibility of the detection device IPD and the display device DSP including the detection device IPD is improved.

In addition, also in the present configuration example, since the projection PS is apart from the detection electrode Rx, it is possible to prevent the detection electrode Rx from being broken and to improve reliability of the detection device IPD and the display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detection device comprising:
   a base;
   a sensor electrode provided on the base, the sensor electrode bending in a planar view;
   an insulating layer on the sensor electrode; and
   a projection provided on the insulating layer, wherein
   the insulating layer is between the sensor electrode and the projection,
   the sensor electrode includes a drive electrode, a detection electrode and a dummy electrode,
   the projection is provided in a region formed using two sets of two electrode pieces parallel to each other among the detection electrode, the drive electrode, and the dummy electrode, and is apart from the detection electrode, the drive electrode, and the dummy electrode in a planar view.

2. The detection device according to claim 1, wherein
   the detection electrode bends from one to another of two directions intersecting with each other,
   the projection comprises a long side and a short side in a planar view, and
   an extending direction of the long side of the projection matches one of the two directions.

3. The detection device according to claim 2, wherein an extending direction of the short side of the projection matches the other of the two directions.

4. The detection device according to claim 1, wherein the insulating layer comprises an organic insulating material.

5. The detection device according to claim 1, wherein the insulating layer comprises an inorganic insulating material.

6. The detection device according to claim 1, wherein the projection and the insulating layer are made of an equal material.

7. The detection device according to claim 1, wherein the projection and the insulating layer are made of different materials.

8. A detection device comprising:
   a base;
   a sensor electrode provided on the base, the sensor electrode bending from one to another of two directions intersecting with each other;
   an insulating layer on the sensor electrode; and
   a projection provided on the insulating layer, wherein
   the insulating layer is between the sensor electrode and the projection,
   the sensor electrode includes a drive electrode, a detection electrode and a dummy electrode,
   the projection is provided in a region formed using two sets of two electrode pieces parallel to each other among the detection electrode, the drive electrode, and the dummy electrode, and is apart from the detection electrode, the drive electrode, and the dummy electrode in a planar view,
   the projection comprises a long side and a short side in a planar view, and
   an extending direction of the long side of the projection matches one of the two directions.

9. The detection device according to claim 8, wherein
   the detection electrode bends from one to the other of the two directions, and
   the extending direction of the short side of the projection matches the other of the two directions.

10. The detection device according to claim 8, wherein an extending direction of the short side of the projection matches the other of the two directions.

* * * * *